United States Patent
Shin

(10) Patent No.: US 7,317,212 B2
(45) Date of Patent: Jan. 8, 2008

(54) LIGHT EMITTING DIODE

(75) Inventor: Johngeon Shin, Seongman-si (KR)

(73) Assignee: LG Electronics Inc., Seoul (KR)

( * ) Notice: Subject to any disclaimer, the term of this patent is extended or adjusted under 35 U.S.C. 154(b) by 126 days.

(21) Appl. No.: 11/049,747

(22) Filed: Feb. 4, 2005

(65) Prior Publication Data
US 2005/0173718 A1    Aug. 11, 2005

(30) Foreign Application Priority Data
Feb. 5, 2004    (KR) .................. 10-2004-0007441

(51) Int. Cl.
*H01L 29/22*    (2006.01)
(52) U.S. Cl. ........................... 257/98; 257/99

(58) Field of Classification Search .............. 257/98, 257/99
See application file for complete search history.

(56) References Cited

U.S. PATENT DOCUMENTS

| | | | |
|---|---|---|---|
| 3,981,023 A | 9/1976 | King et al. ............. | 357/17 |
| 6,465,808 B2 * | 10/2002 | Lin ........................ | 257/81 |
| 7,071,494 B2 * | 7/2006 | Steigerwald et al. .... | 257/98 |

* cited by examiner

*Primary Examiner*—Mark V. Prenty
(74) *Attorney, Agent, or Firm*—Ked & Associates, LLP

(57) ABSTRACT

The present invention relates to a light emitting diode. According to the present invention, a structure capable of reducing total reflection of light, including micro-lenses or projections made of a material with a refractive index different from that of a semiconductor layer in the vicinity of an active layer, is formed within or on the surface of the semiconductor layer in the vicinity of an active layer so that light generated in an active layer of the light emitting diode can be efficiently extracted to enhance luminance.

8 Claims, 5 Drawing Sheets

LIGHT EMITTING DIODE

BACKGROUND OF THE INVENTION

1. Field of the Invention

The present invention relates to a light emitting diode, and more particularly, to a light emitting diode (LED), wherein a structure that is capable of reducing total reflection of light is formed within or on the surface of a semiconductor layer on a top or bottom surface of an active layer so that light from an LED is efficiently extracted to enhance luminance.

2. Description of the Related Art

The technology for fabricating light emitting diodes (LEDs) using Group III/V semiconductor materials has expanded its application range from the development of red LEDs using AlGaAs/GaAs into the development of red and green LEDs using AlGaInP/InP. Recently, full colors can be implemented due to the development of blue LEDs using GaN-based materials, so that the use of LEDs has widely expanded into signal lamps, full-color displays and the like.

Further, GaN-based materials have been connected to the development of ultraviolet LEDs, thereby more increasing the possibility of LEDs for general use in lighting apparatus in the future.

Although such various kinds of LEDs have been developed and widely used, studies on enhancing luminance of LEDs still have been conducted.

To enhance luminance of LEDs, there have been conducted studies on methods of improving structures in growth of the LEDs, and improving chip designs and assemblability.

However, if quantum efficiency is taken into consideration, there are limitations on methods of enhancing luminance by modifying structures of LEDs. Thus, studies on enhancing extraction efficiency to improve extraction of light generated inside LEDs have actively been conducted in recent years.

To enhance such extraction efficiency, there have been made various attempts to decrease absorption or reflection of the light generated at an interface between materials. For example, to reduce total reflection generated at an interface between sapphire and a nitride in a nitride-based LED, a method of forming patterns or corrugations on a sapphire substrate has been mainly used, and a method of eliminating absorption or total reflection by separating a sapphire substrate has also been attempted.

Further, to reduce total reflection caused by a difference in refractive indexes of a nitride and air, there is a method of enhancing extraction efficiency by roughening a surface of the nitride.

Moreover, there have been attempted many methods of efficiently extracting light generated inside LEDs by improving chip designs and assemblability.

SUMMARY OF THE INVENTION

The present invention is conceived to solve the aforementioned problems. Accordingly, an object of the present invention is to provide an LED, wherein a structure that is capable of reducing total reflection of light is formed within or on a surface of a semiconductor layer on a top or bottom surface of an active layer so that light from an LED is efficiently extracted to enhance luminance.

According to a first aspect of the present invention for achieving the object, there is provided a light emitting diode comprising an N-semiconductor layer, an active layer and a P-semiconductor layer sequentially formed on a substrate; an N electrode pad formed on an exposed region of the N-semiconductor layer, which is formed to be exposed by partially etching the layers from the P-semiconductor layer to a portion of the N-semiconductor layer; and a P electrode pad formed on the P-semiconductor layer, wherein a plurality of micro-lenses spaced apart from one another and having a refractive index smaller than that of the N-semiconductor layer or P-semiconductor layer are arrayed in either an inner region of any one of the N-semiconductor layer and the P-semiconductor layer, or inner regions of both of the N-semiconductor layer and the P-semiconductor layer.

According to a second aspect of the present invention for achieving the object, there is provided a light emitting diode comprising an active layer and a P-semiconductor layer sequentially formed on an N-semiconductor substrate; an N electrode pad formed beneath the N-semiconductor substrate; and a P electrode pad formed on the P-semiconductor layer, wherein a plurality of micro-lenses spaced apart from one another and having a refractive index smaller than that of the N-semiconductor substrate or P-semiconductor layer are arrayed in either an inner region of any one of the N-semiconductor substrate and the P-semiconductor layer, or inner regions of both of N-semiconductor substrate and the P-semiconductor layer.

According to a third aspect of the present invention for achieving the object, there is provided a light emitting diode comprising an active layer and a P-semiconductor layer sequentially formed on an N-semiconductor substrate; an N electrode pad formed beneath the N-semiconductor substrate; and a P electrode pad formed on the P-semiconductor layer, wherein a plurality of projections spaced apart from one another and having a refractive index smaller than that of the N-semiconductor substrate or the P-semiconductor layer are arrayed on either any one of a bottom surface of the N-semiconductor substrate and a top surface of the P-semiconductor layer, or both of the bottom surface of the N-semiconductor substrate and the top surface of the P-semiconductor layer.

According to a fourth aspect of the present invention for achieving the object, there is provided a light emitting diode comprising an N-semiconductor layer, an active layer and a P-semiconductor layer sequentially formed on a substrate; an N electrode pad formed on an exposed region of the N-semiconductor layer, which is formed to be exposed by partially etching the layers from the P-semiconductor layer to a portion of the N-semiconductor layer; and a P electrode pad formed on the P-semiconductor layer, wherein a plurality of projections spaced apart from one another and having a refractive index smaller than that of the N-semiconductor layer or P-semiconductor layer are arrayed on either a top surface of the P-semiconductor layer, or an interface between the substrate and the N-semiconductor layer.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Hereinafter, preferred embodiments of the present invention will be described in detail with reference to the accompanying drawings.

Figure 1:
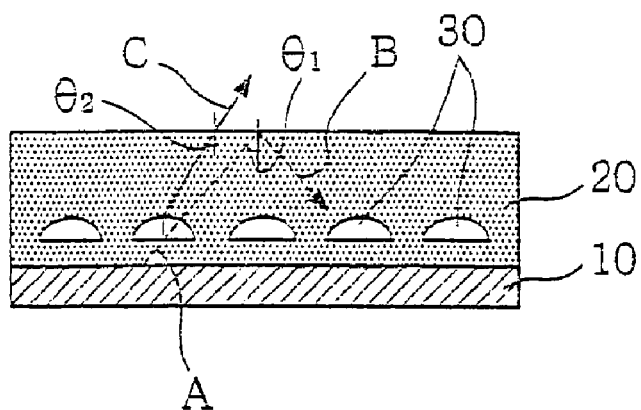
FIG. 1 is a conceptual view illustrating a method of enhancing luminance of an LED according to a first embodiment of the present invention.

FIG. 1 is a conceptual view illustrating a method of enhancing luminance of an LED according to a first embodiment of the present invention. A P-GaN layer 20 formed on an active layer 10 includes a plurality of micro-lenses 30, which is made of a material with a refractive index smaller than that of the P-GaN layer 20, therein.

Each of the micro-lenses 30 may be formed to have a convex top surface, or convex top and bottom surfaces.

If there is no micro-lens 30 within the P-GaN layer 20, light proceeding along path A at an angle $\theta_1$ larger than a critical angle after being emitted from the active layer 10 is not emitted outward due to total reflection and proceeds along path B, as shown in FIG. 1.

If there are the micro-lenses 30 within the P-GaN layer 20, the light is refracted in one of the micro-lenses 30 and then proceeds and is emitted outward along path C at an angle $\theta_2$, which is less than the critical angle, due to the radius of curvature of the micro-lens 30.

Therefore, since the plurality of micro-lenses 30 are formed within the P-GaN layer 20 of the LED in the first embodiment of the present invention, total reflection of the light emitted from the active layer 10 can be reduced, thereby reducing loss of the light.

Further, when the light generated in the active layer reaches the micro-lenses, the light can be emitted into the air without a great deal of loss due to focusing of the lenses.

Consequently, it is possible to enhance the light-extracting efficiency of the LED.

Meanwhile, a method of forming the micro-lenses will be described by way of example with reference to FIG. 1. The method can be implemented by forming a P-GaN layer on the active layer 10, forming a light-transmitting material into an array of micro-lenses on the P-GaN layer, and growing a P-GaN layer again on the P-GaN layer including the micro-lens array.

Here, the light-transmitting material is one of ITO, ZnO, IrO, CuO, NiO, InO, $Al_2O_3$, TiO, SnO, $SrTiO_3$, $SiO_2$, $Si_3N_4$, Al, Ni, Au, Co and Cr.

Figure 2A:
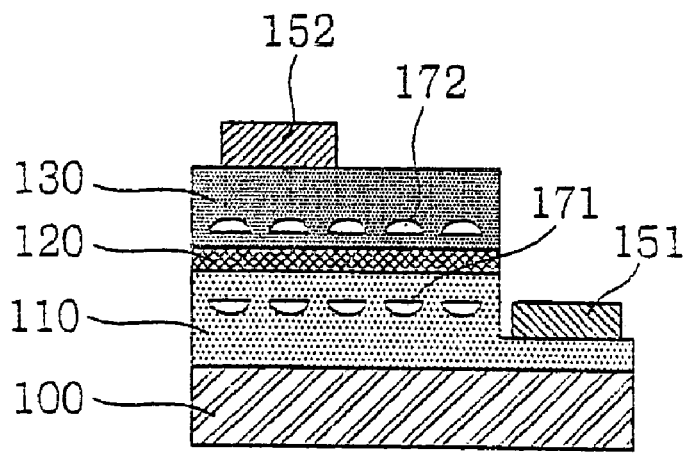
FIGS. 2a and 2b are schematic sectional views of LEDs according to the first embodiment of the present invention.
Figure 2B:
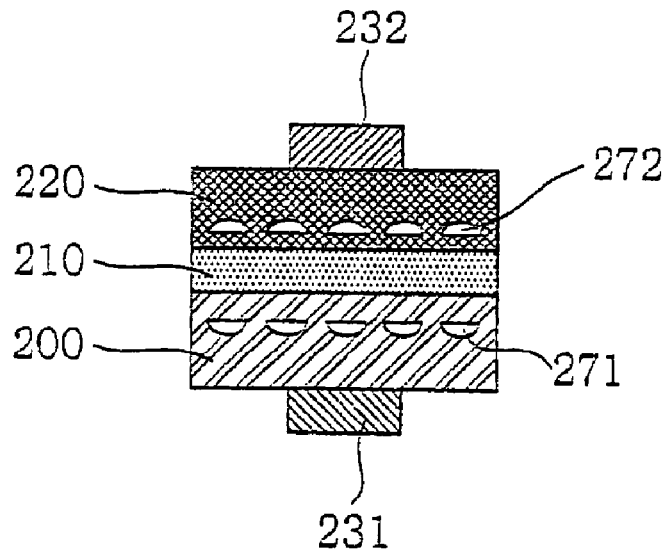

FIGS. 2a and 2b are schematic sectional views of LEDs according to the first embodiment of the present invention. First, in an LED shown in FIG. 2a, an N-GaN layer 110, an active layer 120 and a P-GaN layer 130 are sequentially formed on a sapphire substrate 100; a certain region of the N-GaN layer 110 is exposed by partially etching the layers from the P-GaN layer 130 to a portion of the N-GaN layer 110; a plurality of micro-lenses 171 and 172, which are spaced apart from one another, are arrayed within the N-GaN layer 110 and the P-GaN layer 130; and an N electrode pad 151 is formed on the exposed region of the N-GaN layer 110 and a P electrode pad 152 is formed on the P-GaN layer 130.

Further, in an LED shown in FIG. 2b, an active layer 210 and a P-AlGaAs layer 220 are sequentially formed on an N-AlGaAs substrate 200; a plurality of micro-lenses 271 and 272, which are spaced apart from one another, are arrayed at inner regions of the N-AlGaAs substrate 200 and P-AlGaAs layer 220 in the vicinity of the active layer 210; and the an N electrode pad 231 is formed beneath the N-AlGaAs substrate 200 and a P electrode pad 232 is formed on the P-AlGaAs layer 220.

In the structures of FIGS. 2a and 2b, the micro-lenses may be implemented independently in only either an N-type semiconductor layer or a P-type semiconductor layer in the vicinity of an active layer, or may be implemented simultaneously in both an N-type layer and a P-type layer.

Here, it is preferred that the micro-lenses be arrayed parallel to the active layer.

Figure 3:
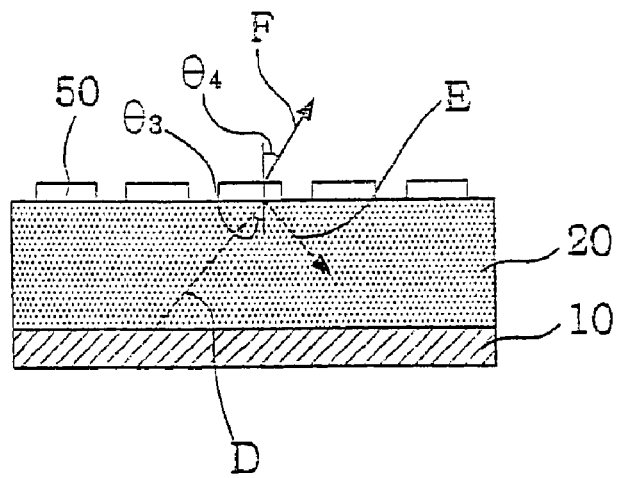
FIG. 3 is a conceptual view illustrating a method of enhancing luminance of an LED according to a second embodiment of the present invention.

FIG. 3 is a conceptual view illustrating a method of enhancing luminance of an LED according to a second embodiment of the present invention. A plurality of projections 50, which are made of a material with a refractive index smaller than that of the P-GaN layer 20 and spaced apart from one another, are formed on the P-GaN layer 20 formed on the active layer 10.

If there is no projection 50 within the P-GaN layer 20, light proceeding along path D at an angle $\theta_3$ larger than the critical angle after being emitted from the active layer 10 is not emitted outward due to total reflection and proceeds along path E.

On the contrary, if there are the projections 50 within the P-GaN layer 20, the light 20 is refracted at the projections 50 and then proceeds and is emitted outward along path F at an angle $\theta_4$ that is less than the critical angle.

At this time, the reason why the light proceeds at the angle smaller than the critical angle when the light is emitted outward through the projections 50 is that the refractive index of the projections 50 is less than that of the P-GaN layer 20.

Therefore, since the plurality of projections 50 are formed on the P-GaN layer 20 of the LED in the second embodiment of the present invention, total reflection of the light emitted from the active layer 10 can be reduced, thereby reducing loss of the light.

Figure 4A:
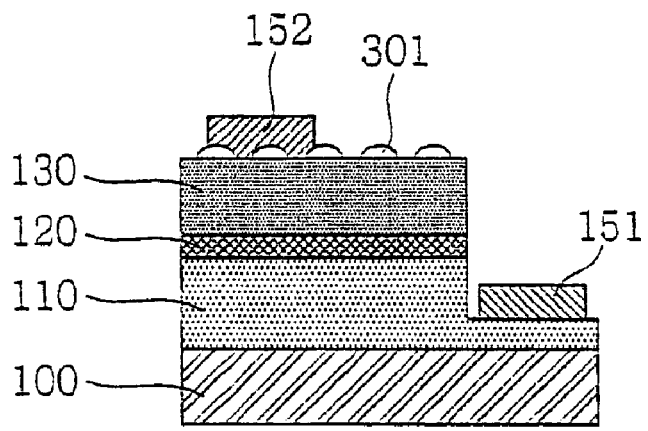
FIGS. 4a to 4c are schematic sectional views of LEDs according to the second embodiment of the present invention.
Figure 4B:
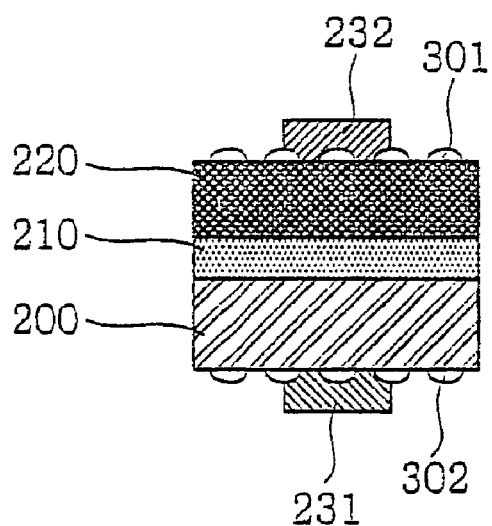
Figure 4C:
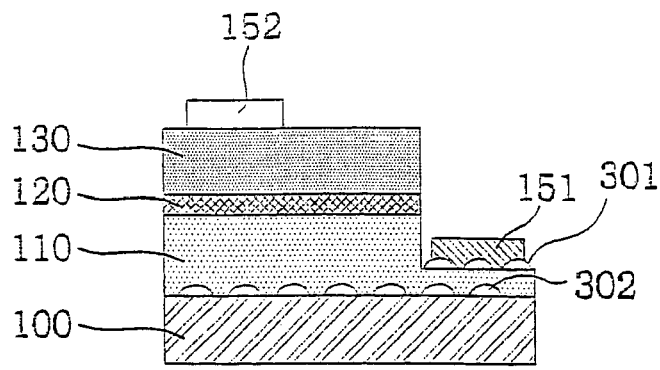
Figure 5A:
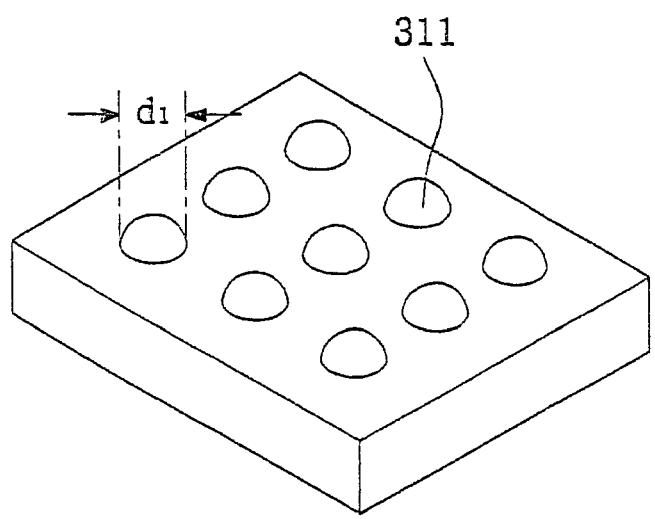
FIGS. 5a to 5e are perspective views showing the shapes of projections according to the second embodiment of the present invention.
Figure 5B:
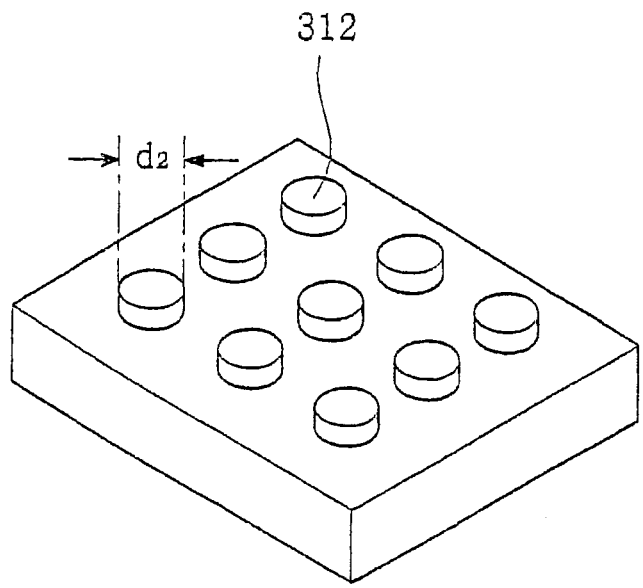
Figure 5C:
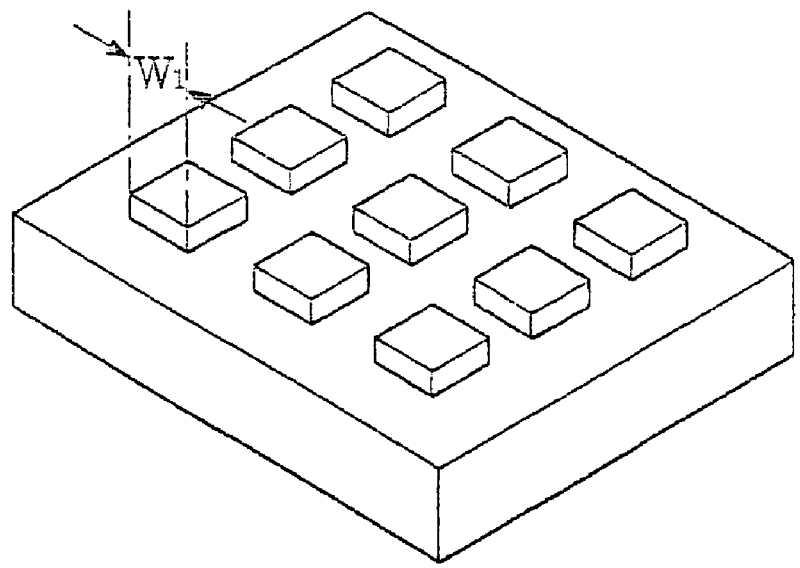
Figure 5D:
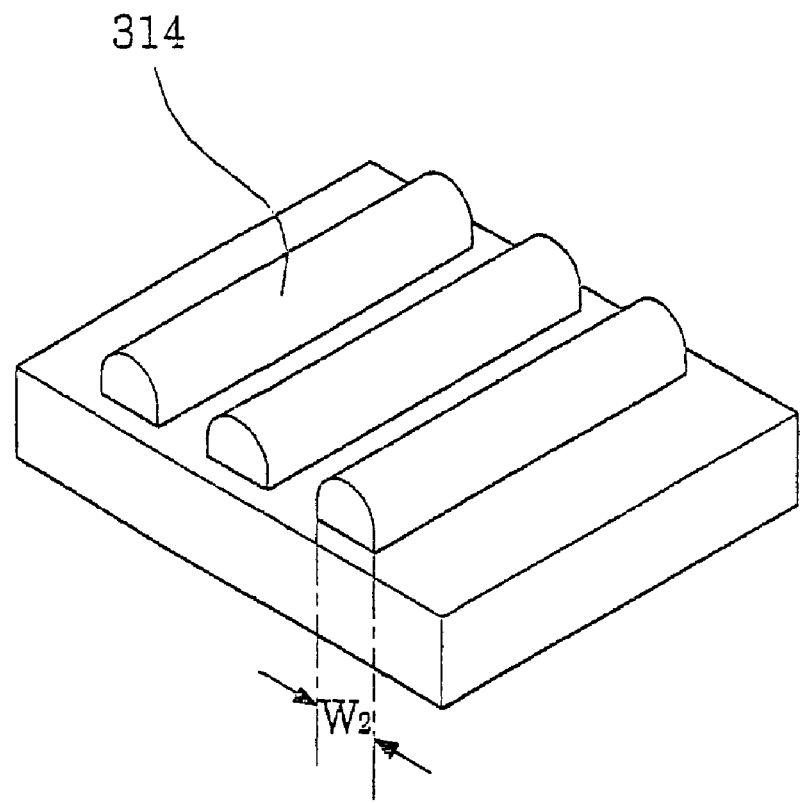
Figure 5E:
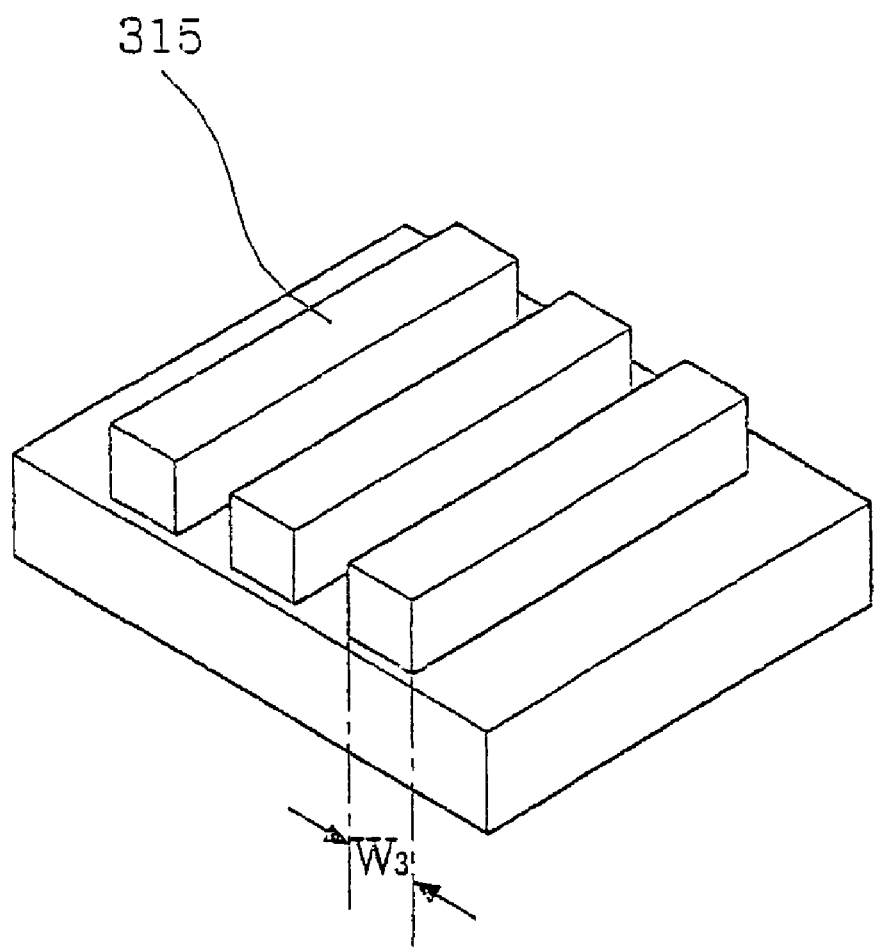

FIGS. 4a to 4c are schematic sectional views of LEDs according to the second embodiment of the present invention. In an LED shown in FIG. 4a, as compared with the structure of the LED shown in FIG. 2a, a micro-lens is not formed within the P-GaN layer 130 and a plurality of projections 301 made of a material with a refractive index smaller than that of the P-GaN layer 130 are formed on the P-GaN layer 130.

Further, in an LED shown in FIG. 4b, as compared with the structure of the LED shown in FIG. 2b, a micro-lens is not formed within the N-AlGaAs substrate 200 and the P-AlGaAs layer 220, and a plurality of projections 301 and 302 made of materials with refractive indexes respectively smaller than those of the P-AlGaAs layer 220 and the N-AlGaAs substrate 200 are formed on the P-AlGaAs layer 220 and beneath the N-AlGaAs substrate 200.

At this time, in the LEDs of FIGS. 4a and 4b, it is possible to form a transparent electrode for diffusing an electric current on the P-GaN layer 130 and the P-AlGaAs layer 220, or to form the projections on the transparent electrode for diffusing an electric current.

Further, in an LED shown in FIG. 4c, an N-semiconductor layer 110, an active layer 120 and a P-semiconductor layer 130 are sequentially formed on a substrate 100; a certain region of the N-semiconductor layer 110 is exposed by partially etching the layers from the P-semiconductor layer 130 to a portion of the N-semiconductor layer 110; and an N electrode pad 151 is formed on the exposed region of the N-semiconductor layer 110 and a P electrode pad 152 is formed on the P-semiconductor layer 130.

A plurality of projection portions 301 and 302, which are spaced apart from one another and have refractive index smaller than that of the N-semiconductor layer 110, are arrayed on the exposed region of the N-semiconductor layer 110 or on an interface between the substrate 100 and the N-semiconductor layer 110.

Further, the N electrode pad 151 is formed on the exposed region of the N-semiconductor layer 110 while covering some of the plurality of projections 301.

FIGS. 5a to 5e are perspective views showing the shapes of projections according to the second embodiment of the present invention. The projections may be formed into any ones of micro-lenses (311 in FIG. 5a), cylinders (312 in FIG. 5b) and square posts (313 in FIG. 5c), which are arranged in rows and columns, or any ones of semicircular posts (314 in FIG. 5d) and rectangular posts (315 in FIG. 5e), which are arranged in stripe patterns.

Here, it is preferred that the diameter $d_1$ of the micro-lens, the diameter $d_2$ of the cylinder, the width $W_1$ of the square post, the line width $W_2$ of the semicircular post and the line width $W_3$ of the rectangular post be in the range of 1 nm to 100 μm.

As described above, the present invention can maximize the extraction efficiency of light generated in an LED by employing a material with a different index from that of a semiconductor layer in the vicinity of an active layer, within or on the surface of the semiconductor layer in the vicinity of an active layer for the purpose of enhancing luminance when LEDs are manufactured using semiconductor compound materials.

Further, the micro-lenses and the projections may be formed out of films of transparent conducting oxides (TCO) such as ITO, ZnO and IrO, dielectric materials such as $SiO_2$ and $Si_3N_4$, or metals such as Al, Ni, Au, Co and Cr. When they are in the form of micro-lenses, the effects thereof can be maximized.

At this time, the micro-lenses and the projections are formed at constant intervals or randomly.

As described above, the present invention has an advantage in that the structure capable of reducing total reflection of light is formed within or on a surface of a semiconductor layer on a top or bottom surface of an active layer so that light from an LED is efficiently extracted to enhance luminance.

Although the present invention has been described in detail in connection with the specific embodiments, it will be readily understood by those skilled in the art that various modifications and changes can be made thereto within the technical spirit and scope of the present invention. It is also apparent that the modifications and changes fall within the scope of the present invention defined by the appended claims.

What is claimed is:

1. A light emitting diode comprising an N-semiconductor layer, an active layer and a P-semiconductor layer sequentially formed on a substrate; an N electrode pad formed on an exposed region of the N-semiconductor layer, the exposed region being formed by partially etching the layers from the P-semiconductor layer to a portion of the N-semiconductor layer; and a P electrode pad formed on the P-semiconductor layer, wherein:

a plurality of micro-lenses spaced apart from one another and having a refractive index smaller than that of the N-semiconductor layer or P-semiconductor layer are arrayed in either an inner region of any one of the N-semiconductor layer and the P-semiconductor layer, or inner regions of both of the N-semiconductor layer and the P-semiconductor layer.

2. A light emitting diode comprising an active layer and a P-semiconductor layer sequentially formed on an N-semiconductor substrate; an N electrode pad formed beneath the N-semiconductor substrate; and a P electrode pad formed on the P-semiconductor layer, wherein:

a plurality of micro-lenses spaced apart from one another and having a refractive index smaller than that of the N-semiconductor substrate or P-semiconductor layer are arrayed in either an inner region of any one of the N-semiconductor substrate and the P-semiconductor layer, or inner regions of both of N-semiconductor substrate and the P-semiconductor layer.

3. The light emitting diode as claimed in 2, wherein the micro-lenses are made of any one of ITO, ZnO, IrO, CuO, NiO, InO, $Al_2O_3$, TiO, SnO, $SrTiO_3$, $SiO_2$, $Si_3N_4$, Al, Ni, Au, Co and Cr.

4. A light emitting diode comprising:

an N-semiconductor layer, an active layer and a P-semiconductor layer sequentially formed on a substrate;

an N electrode pad formed on an exposed region of the N-semiconductor layer, the exposed region being formed by partially etching the layers from the P-semiconductor layer to a portion of the N-semiconductor layer; and a P electrode pad formed on the P-semiconductor layer, wherein:

a plurality of light-transmitting projections spaced apart from one another and having a refractive index smaller than that of the N-semiconductor layer or P-semiconductor layer are arrayed on either a top surface of the P-semiconductor layer, or an interface between the substrate and the N-semiconductor layer, wherein the plurality of projections spaced apart from one another and having a refractive index smaller than that of N-semiconductor layer or P-semiconductor layer are further arrayed on the exposed region of the N-semiconductor layer, and wherein the N electrode pad is formed on the exposed region of the N-semiconductor layer while covering some of the plurality of projections.

5. The light emitting diode as claimed in claim 4, wherein the projections are formed into any ones of micro-lenses, cylinders and square posts, which are arranged in rows and columns, or any ones of rectangular posts and semicircular posts, which are arranged in stripe patterns.

6. The light emitting diode as claimed in claim 4, wherein the projections are formed at constant intervals or randomly.

7. The light emitting diode as claimed in claim 4, wherein the projections are made of any one of ITO, ZnO, IrO, CuO, NiO, InO, $Al_2O_3$, TiO, SnO, $SrTiO_3$, $SiO_2$, $Si_3N_4$, Al, Ni, Au, Co and Cr.

8. The light emitting diode as claimed in claim 5, wherein the diameter ($d_1$) of the micro-lens, the diameter ($d_2$) of the cylinder, the width ($W_1$) of the square post, the line width ($W_2$) of the semicitcular post and the line width ($W_3$) of the rectangular post range from 1 nm to 100 nm.

* * * * *